United States Patent
Yoon et al.

(10) Patent No.: US 7,432,785 B2
(45) Date of Patent: Oct. 7, 2008

(54) THIN FILM RESONATOR, METHOD FOR MAKING THIN FILM RESONATOR AND FILTER HAVING THIN FILM RESONATORS

(75) Inventors: Yong-seop Yoon, Seoul (KR); Yun-kwon Park, Dongducheon-si (KR); Hyung Choi, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 229 days.

(21) Appl. No.: 10/936,522

(22) Filed: Sep. 9, 2004

(65) Prior Publication Data

US 2005/0052261 A1    Mar. 10, 2005

(30) Foreign Application Priority Data

Sep. 9, 2003   (KR) .................... 10-2003-0063389

(51) Int. Cl.
*H03H 9/00* (2006.01)
*H03H 9/09* (2006.01)
*H03H 9/54* (2006.01)

(52) U.S. Cl. .................................. 333/189; 333/188

(58) Field of Classification Search ............... 333/187, 333/188, 189, 190; 310/326
See application file for complete search history.

(56) References Cited

U.S. PATENT DOCUMENTS

| | | | |
|---|---|---|---|
| 4,642,508 A | | 2/1987 | Suzuki et al. |
| 5,910,756 A | * | 6/1999 | Ella ............................ 333/133 |
| 6,204,737 B1 | * | 3/2001 | Ella ............................ 333/187 |
| 6,249,074 B1 | | 6/2001 | Zimnicki et al. |
| 6,469,597 B2 | | 10/2002 | Ruby et al. |
| 6,617,751 B2 | | 9/2003 | Sunwoo et al. |
| 6,774,746 B2 | * | 8/2004 | Whatmore et al. ........... 333/189 |
| 2002/0121945 A1 | | 9/2002 | Ruby et al. |
| 2003/0006672 A1 | | 1/2003 | Sunwoo et al. |

FOREIGN PATENT DOCUMENTS

| | | |
|---|---|---|
| CN | 1276918 A | 12/2000 |
| CN | 1386319 A | 12/2002 |
| EP | 1 078 453 B1 | 2/2001 |
| EP | 1078453 A | 2/2001 |
| JP | 63-309802 A | 12/1988 |
| JP | 3-175809 A | 7/1991 |
| JP | 11-284480 A | 10/1999 |

(Continued)

OTHER PUBLICATIONS

European Search Report; Mar. 2006.

(Continued)

*Primary Examiner*—Dean O Takaoka
(74) *Attorney, Agent, or Firm*—Sughrue Mion, PLLC

(57) ABSTRACT

A thin film resonator having a membrane layer formed on top of a substrate, a lower electrode formed on part of the top surface of the membrane layer, a piezoelectric layer formed on top of the lower electrode, an upper electrode formed on top of the piezoelectric layer, and a mass loading layer interposed between the lower electrode and the membrane layer and having a predetermined mass. This structure enables precise adjustment of the resonant frequency of the thin film resonator, thereby providing a more precise filter.

1 Claim, 7 Drawing Sheets

FOREIGN PATENT DOCUMENTS

| | | |
|---|---|---|
| JP | 2001-111371 A | 4/2001 |
| JP | 2001-326553 A | 11/2001 |
| JP | 2002-198758 A | 7/2002 |
| JP | 2002-299980 A | 10/2002 |

OTHER PUBLICATIONS

"Constant of Elasticity", 1997, p. 446.

Chinese Office Action dated Dec. 21, 2007 issued in Chinese Patent Application No. 200410078536.1.

* cited by examiner

THIN FILM RESONATOR, METHOD FOR MAKING THIN FILM RESONATOR AND FILTER HAVING THIN FILM RESONATORS

CROSS-REFERENCE TO RELATED APPLICATIONS

This application claims the benefit of Korean Application No. 2003-63389, filed Sep. 9, 2003, in the Korean Intellectual Property Office, the disclosure of which is incorporated herein by reference.

BACKGROUND

1. Field of the Invention

The present invention relates to a filter comprising a combination of thin film resonators, and more particularly to a thin film resonator and a method for making the same that are used in the filter.

2. Description of the Related Art

Generally, a filter used for a communication device includes a combination of thin film resonators.

FIG. 1 is a cross-sectional view of a conventional thin film resonator. Referring to FIG. 1, a conventional thin film resonator 100 includes a piezoelectric layer 130, an upper electrode 140 and a lower electrode 120 provided respectively on the upper and lower surfaces of the piezoelectric layer 130, and a membrane layer 110 (also called a "dielectric layer") vibratably supporting the lower electrode 120 on a substrate 10.

The resonant frequency, one of resonant characteristics of the thin film resonator 100, varies depending on the thickness t1 of the piezoelectric layer 130. In recent small-sized thin film resonators, a new technology is adopted to adjust the resonant frequency using the so-called mass loading effect that causes a change of mass according to the thickness t2 of the upper electrode 140, without changing the thickness t1 of the piezoelectric layer 130 which results in a greater variation of the resonant frequency.

In the conventional thin film resonator 100, the lower electrode 120 receives chemical and mechanical impacts during repeated deposition and etching processes during manufacturing of the thin film resonator 100. To endure such chemical and mechanical impacts, the lower electrode 120 should be made of a material having high chemical and mechanical strength, such as molybdenum (Mo) or tungsten (W), rather than a light metal, such as aluminum. However, both molybdenum and tungsten have a greater vibration transfer loss than aluminum due to their high damping factor and are not easily processed. These materials increase the manufacturing cost and complicate the manufacturing process, while lowering overall efficiency of the thin film resonator 100.

As described above, recently it has become possible to adjust the resonant frequency of the thin film resonator 100 by changing the thickness t2 of the upper electrode 140. The change of the thickness of the upper electrode 140 leads to a much smaller variation of the resonant frequency, as compared to the thickness change of the piezoelectric layer 130. However, as shown in FIG. 2, the resonant frequency of the thin film resonator 100 greatly varies in a wide range of hundreds of MHz even when the thickness of the upper electrode 140 slightly changes by 0.1 µm. Accordingly, it is difficult to manufacture a precise filter that requires a resonant frequency difference between a series resonator group 310 and a parallel resonator group 320 (see FIG. 8) to be tens of MHz.

SUMMARY OF THE INVENTION

In order to overcome the problems as mentioned above, it is an aspect of the present invention to provide a thin film resonator which enables easy adjustment of the resonant frequency and relatively free selection of a material for a lower electrode, a filter comprising the thin film resonator, and a method for manufacturing the thin film resonator.

In order to accomplish the above aspect and/or other features of the present invention, there is provided a thin film resonator comprising a membrane layer formed on a substrate, a lower electrode formed on part of the membrane layer, a piezoelectric layer formed on the lower electrode, an upper electrode formed on the piezoelectric layer, and a mass loading layer interposed between the lower electrode and the membrane layer having a predetermined mass.

This structure enables more precise adjustment of the resonant frequency of the thin film resonator.

According to this aspect of the present invention, when the same level of thickness changes are made to the mass loading layer, upper electrode and membrane layer which originally have the same thickness, the resonant frequency variation by the change of the thickness of the mass loading layer should preferably be smaller than that by the change of the thicknesses of the other layers.

In another aspect of the present invention, there is provided a thin film resonator comprising a membrane layer formed on a substrate, a lower electrode formed on the membrane layer, a piezoelectric layer formed on the lower electrode and an upper electrode formed on the piezoelectric layer, wherein the top and bottom of said lower electrode are surrounded by the membrane layer.

According to this aspect, the resonant frequency of the thin film resonator can be precisely adjusted without any damage to the lower electrode. It is possible to reduce the chemical and mechanical impacts transferred to the lower electrode during the processes of depositing and etching the piezoelectric layer and the upper electrode, thereby enabling free selection of a material for the lower electrode.

Preferably, the lower electrode should be made of a conductive material having a higher modulus of elasticity in tension than the membrane layer.

The thin film resonator further comprises a mass loading layer sandwiched between the lower electrode and the membrane layer and having a predetermined thickness.

Preferably, the top and bottom of the mass loading layer should be surrounded by the membrane layer.

Preferably, the mass loading layer should be made of a material having a higher modulus of elasticity in tension than the membrane layer, and lower modulus of elasticity in tension than the lower electrode. Also, the membrane layer should be made of any one of a dielectric and a polymer coating material.

For the mass loading layer, it is preferable to select a material that causes small variation of resonant frequency of the thin film resonator according to the change of its thickness.

In order to manufacture a thin film resonator according to the above aspects of the invention, there is provided a method comprising: forming a first membrane layer on a substrate; forming a lower electrode on the first membrane layer; forming a second membrane layer on top of the lower electrode; forming a piezoelectric layer on the second membrane layer; and forming an upper electrode on the piezoelectric layer.

Forming the lower electrode on the first membrane layer may preferably include: forming at least one mass loading layer on the first membrane layer; and forming the lower electrode on top of the mass loading layer.

Also, it is preferable to form the membrane layer between respective mass loading layers and between the lower electrode and the top mass loading layer.

Forming a first membrane layer on a substrate may preferably include: forming and patterning a sacrificial layer on the substrate; and forming the first membrane layer on the sacrificial layer. After the second electrode is formed, the sacrificial layer may be removed by etching.

In still another aspect of the present invention, there is provided a filter consisting of a first resonator group which is a combination of at least one first thin film resonator formed on a substrate to be connected in series to a predetermined circuit and a second resonator group which is a combination of at least one second thin film resonator connected in parallel to the circuit, wherein said first thin film resonator has a greater resonant frequency than the second thin film resonator, said first thin film resonator comprising a membrane layer, a lower electrode, a piezoelectric layer and an upper electrode sequentially formed on the substrate, said second thin film resonator comprising a membrane layer, a mass loading layer, a lower electrode, a piezoelectric layer and an upper electrode sequentially formed on the substrate. Preferably, the top and bottom of each of the mass loading layer and lower electrode of the second thin film resonator should be surrounded by the membrane layer.

According to this aspect of the invention, the resonant frequency difference between the first and second thin film resonators can be precisely adjusted, which enables manufacture of a more precise filter.

BRIEF DESCRIPTION OF THE DRAWINGS

The above objects and other advantages of the present invention will be more apparent from the following detailed description taken in conjunction with the accompanying drawings, in which.

DETAILED DESCRIPTION OF THE PREFERRED EMBODIMENTS

Hereinafter, exemplary embodiments of the present invention will be described in detail with reference to the accompanying drawings.

Figure 3:
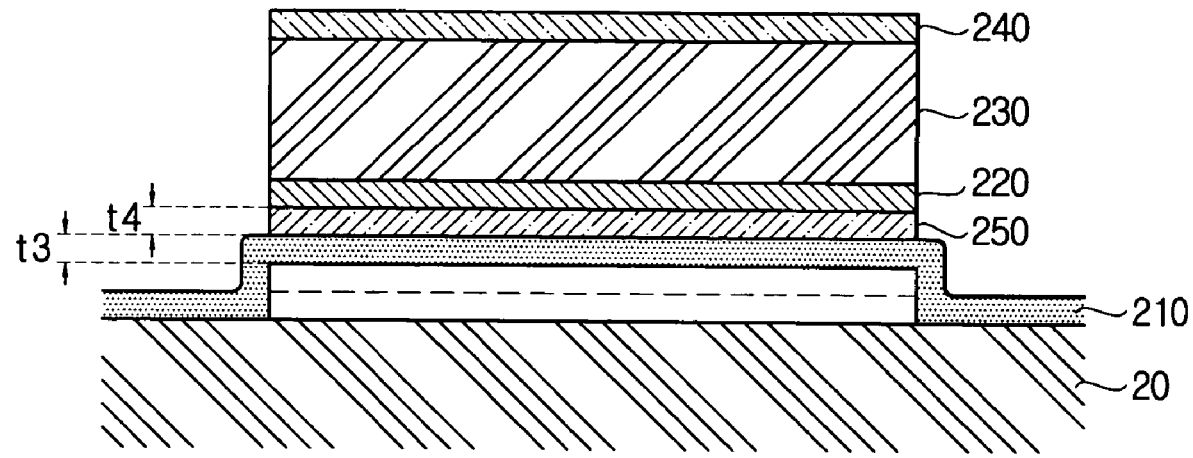
FIG. 3 is a cross-sectional view of a thin film resonator according to a first embodiment of the present invention.

FIG. 3 is a cross-sectional view of a thin film resonator according to a first embodiment of the present invention. As shown in FIG. 3, a thin film resonator 200 comprises a membrane layer 210, a mass loading layer 250, a lower electrode 220, a piezoelectric layer 230 and an upper electrode 240. Since the piezoelectric layer 230 and the upper electrode 240 are identical to those used in a conventional thin film resonator, a detailed explanation thereof will be omitted.

According to the first embodiment, the thin film resonator 200 interposes the mass loading layer 250 between the lower electrode 220 and the membrane layer 210. The resonant frequency of the thin film resonator 200 can be adjusted according to the thickness of the mass loading layer 250.

Figure 1:
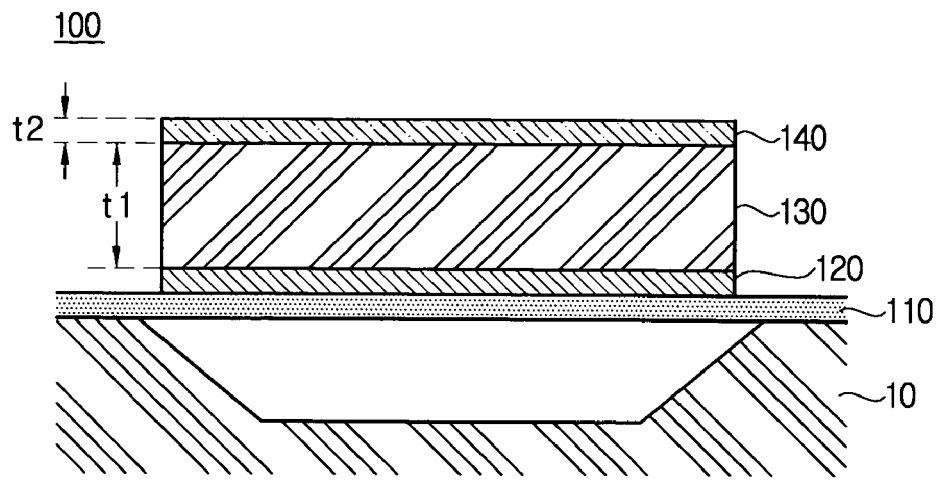
FIG. 1 is a cross-sectional view of a conventional thin film resonator.
Figure 2:
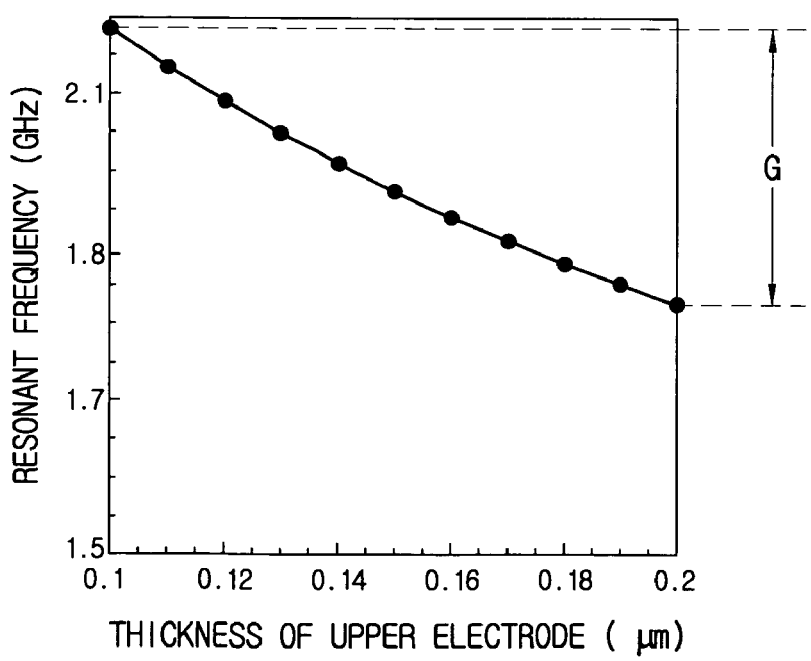
FIG. 2 is a graph showing the variation of resonant frequency by the change of the thickness of an upper electrode of a conventional thin film resonator.
Figure 4A:
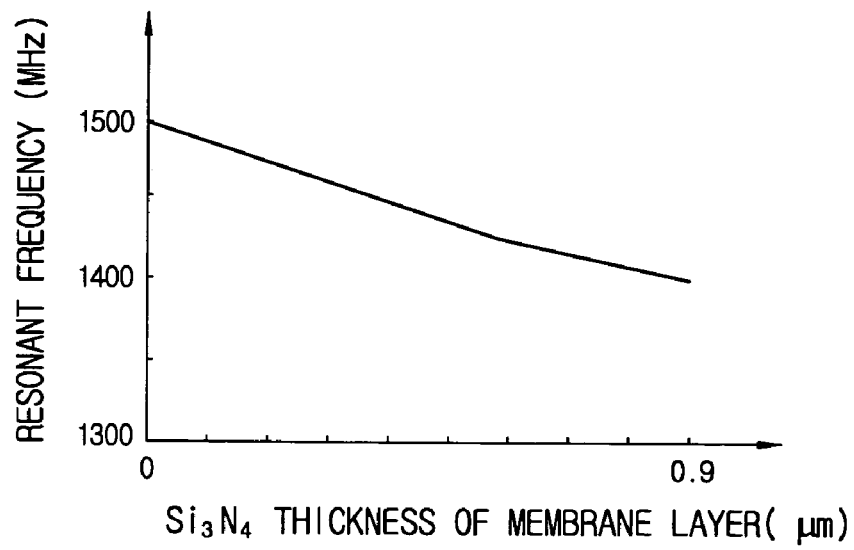
FIG. 4A is a graph showing the variation of resonant frequency by the change of the thickness of a membrane layer of FIG. 3.

The membrane layer 210 is deposited on a substrate 20 to vibratably support the thin film resonator 200 on the substrate 20. The membrane layer 210 vibrates in combination with the vibration of the piezoelectric layer 230. The membrane layer 210 is made of an insulating material, such as silicon nitride ($Si_3N_4$) or silicon dioxide ($SiO_2$). As shown in FIG. 4A, the resonant frequency can be more precisely adjusted when the thickness t3 of the membrane layer 210 is adjusted, as compared to the case when the thickness t2 (see FIG. 1) of the upper electrode 240 is adjusted. Preferably, the thickness t3 of the membrane layer 210 should be adjusted within a predetermined range of thickness in accordance with the limitations in the manufacturing process.

Figure 4B:
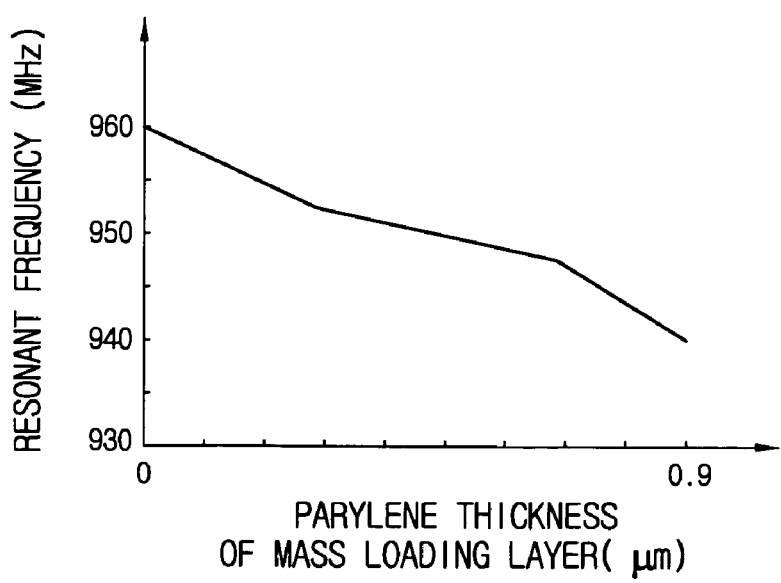
FIG. 4B is a graph showing the variation of resonant frequency by the change of the thickness of a mass loading layer of FIG. 3.

The mass loading layer 250 is provided to easily adjust the resonant frequency of the resonator. When the same level of changes are made to the thickness t4 of the mass loading layer 250 and the thickness t2 of the upper electrode 240 which are originally the same, the change of the thickness t4 of the mass loading layer 250 leads to smaller variation of the resonant frequency of the thin film resonator 200, as compared to the change of the thickness t2 of the upper electrode 240. The mass loading layer 250 should preferably be made of a material that can be easily bonded to the membrane layer 210. FIG. 4B shows the resonant frequency dependence on the thickness of parylene that can be used as a material for the mass loading layer 250 in the first embodiment of the invention.

Figure 5:
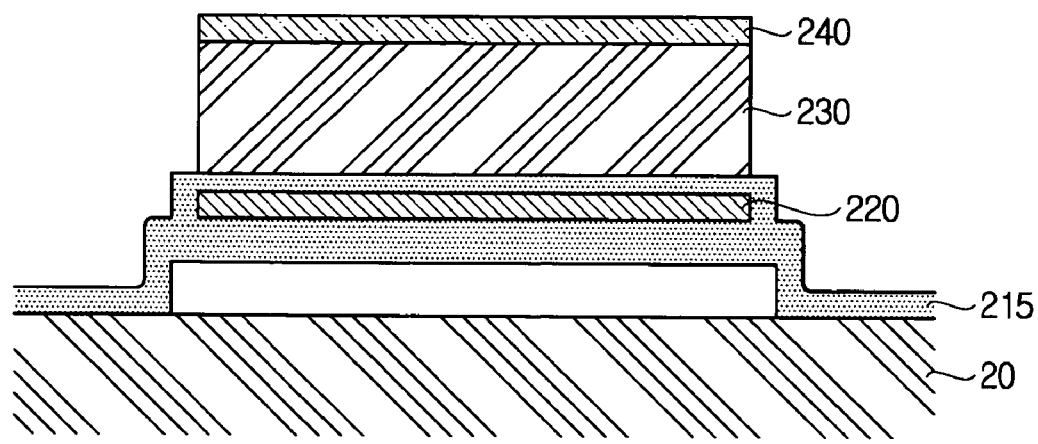
FIG. 5 is a cross-sectional view of a thin film resonator according to a second embodiment of the present invention.

FIG. 5 is a cross-sectional view showing the structure of a thin film resonator according to a second embodiment of the present invention. As shown in FIG. 5, the thin film resonator 200 is characterized in that both the top and bottom of the lower electrode 220 are surrounded by the membrane layer 215. To be specific, the lower electrode 220, made of a metallic material having a greater Young's Modulus, is disposed within a membrane layer 215 made of a material having a smaller Young's Modulus, such as silicon dioxide. The overall rigidity of the membrane layer 215 is thus improved, which consequently prevents distortion of the membrane layer 215 and improves the stability and reliability of the membrane layer 215. Also, the membrane layer 215 can absorb chemical and mechanical impacts that have caused problems in the prior art, and enables free selection of a material for the lower electrode 220, thereby reducing the manufacturing cost and simplifying the process of manufacturing the thin film resonator 200.

Figure 6:
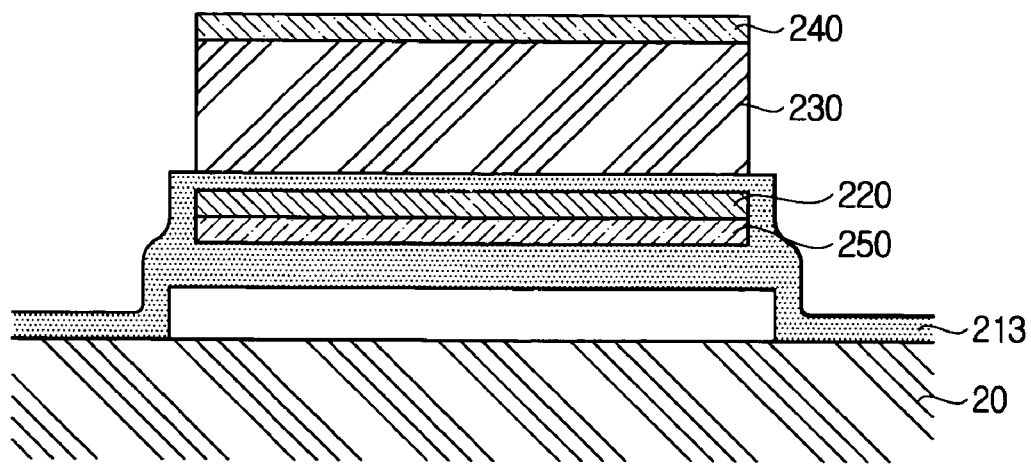
FIG. 6 is a cross-sectional view of a thin film resonator according to a third embodiment of the present invention.

FIG. 6 shows the structure of a thin film resonator 200 according to a third embodiment of the present invention. The thin film resonator 200 includes a membrane layer 213, a mass loading layer 250, a lower electrode 220, a piezoelectric layer 230 and an upper electrode 240. The lower surface of the mass loading layer 250 and the upper surface of the lower electrode 220 are surrounded by the membrane layer 213. Accordingly, the lower electrode 220 and the mass loading layer 250 can be selected from a wide range of materials.

Also, the resonant frequency can be more easily adjusted by the addition of the mass loading layer 250.

Hereinafter, a method for manufacturing a thin film resonator according to the present invention, and particularly the third embodiment, will be explained in detail with reference to the accompanying drawings.

Figure 7A:
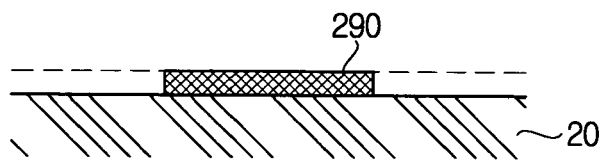
FIGS. 7A to 7F show a process of manufacturing the thin film resonator of FIG. 6.
Figure 7B:
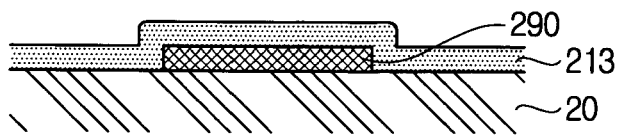

As shown in FIG. 7A, a sacrificial layer 290 is first formed on a substrate 20 and then patterned by a predetermined etching process, for example, photolithography. Subsequently, a membrane layer 213 is formed on top of the sacrificial layer 290 as shown in FIG. 7B. The sacrificial layer 290 remaining after etching is interposed between the membrane layer 213 and the substrate 20.

Figure 7C:
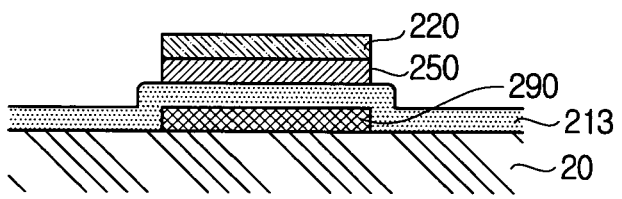

Upon completion of the formation of the membrane layer 213, a mass loading layer 250 is formed and patterned on the membrane layer 213 as shown in FIG. 7C. Subsequently, a lower electrode 220 is formed and patterned on the mass loading layer 250. The mass loading layer 250 should preferably be made of a material, such as parylene, of which thickness change causes small variation in the resonant frequency of the thin film resonator. Also, the lower electrode 220 should preferably be made of a metallic material, such as an aluminum alloy, having a lower damping factor than tungsten or molybdenum. Like the sacrificial layer 290, the lower electrode 220 is etched preferably by photolithography.

Figure 7D:
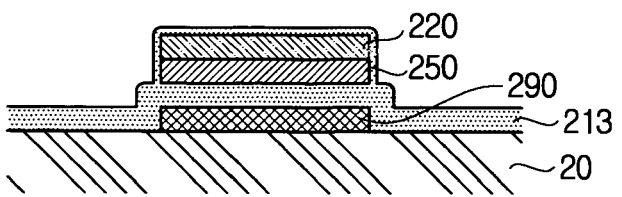

Upon completion of the formation of the lower electrode 220, the membrane layer 213 is formed again on the top of the lower electrode 220 as shown in FIG. 7D. At this time, it is preferable to surround the outer surfaces of the mass loading layer 250 and the lower electrode 220 so that the membrane layer 213 formed on the upper surface of the lower electrode 220 and that formed on the lower surface of the mass loading layer 250 can be joined to form a single body. The material deposited on the upper surface of the lower electrode 220 may, or may not be similar to the material of the membrane layer 213 which is formed on the lower part of the mass loading layer 250. Meanwhile, the lower electrode 220 is contacted with a piezoelectric layer 230 (FIG. 7E) which will be described below through a side thereof (not shown). As a result, although not shown in detail, the electric connection between the lower electrode 220 and the piezoelectric layer 230 can be made more stable by partially etching the membrane layer 213 on the upper surface of the lower electrode 220 and then depositing the piezoelectric layer 230 thereon.

Figure 7E:
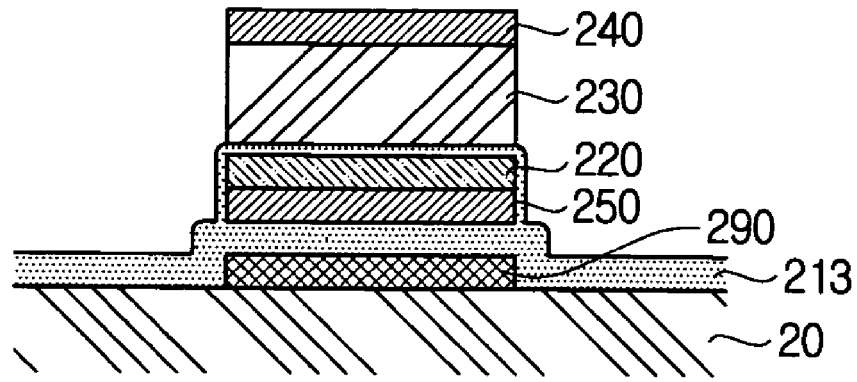
Figure 7F:
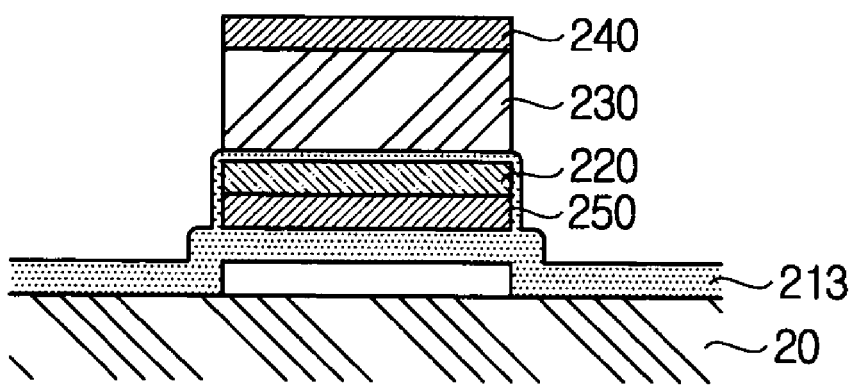

Accordingly, in this third embodiment, after formation of the membrane layer 213, mass loading layer 250 and lower electrode 220, a piezoelectric layer 230 and an upper electrode 240 are sequentially formed on the membrane layer 213 as shown in FIG. 7E. Subsequently, the sacrificial layer 290 is etched and removed as shown in FIG. 7F in order to form a predetermined space between the bottom of the thin film resonator 200 and the substrate 20.

Although a method for manufacturing the thin film resonator 200 in accordance with the third embodiment of the present invention has been explained above, various modifications of the method can be made depending on the desired structure of the thin film resonator 200.

For example, it is possible to etch the substrate 20 in a predetermined pattern and form the sacrificial layer 290 at the etched portion so as to provide a space where the thin film resonator 200 can vibrate between the bottom of the thin film resonator 200 and the substrate 20.

Further, although not illustrated in the drawings, more than two mass loading layers 250 can be formed. In this case, the mass loading layer 250 and the membrane layer 213 are deposited by turns so that the membrane layer 213 can be sandwiched between every two mass loading layers 250.

Figure 8:
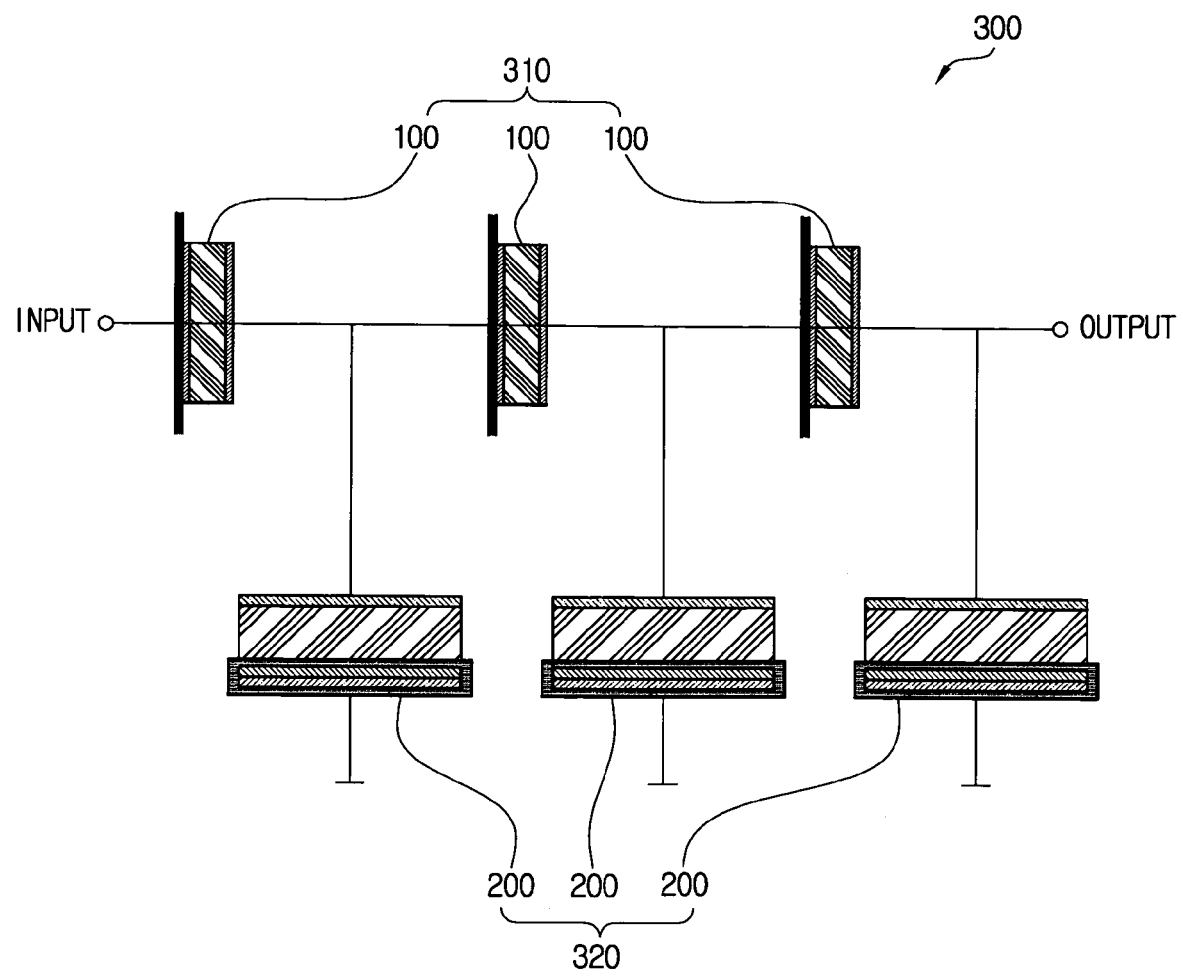
FIG. 8 is a schematic view of a filter having thin film resonators according to the present invention.

FIG. 8 shows the structure of a filter 300 having a combination of thin film resonators 200 according to the present invention. Generally, the filter 300 comprises a series resonator group 310 which is a combination of at least one first thin film resonator 100 and a parallel resonator group 320 which is a combination of at least one second thin film resonator 200. The filter 300 sets a predetermined difference between the resonant frequency of the first thin film resonator 100 and that of the second thin film resonator 200. Recently, such a frequency difference is set to be within a small range of 50 to 60 MHz. In the present invention, the filter 300 may use a conventional thin film resonator (see FIG. 1) as the first thin film resonator 100 and a thin film resonator according to the third embodiment as the second thin film resonator 200. The present invention can easily provide the precise filter 300 by using the thin film resonator 200 which can easily adjust the resonant frequency as the second thin film resonator 200.

As explained above, the thin film resonator according to the present invention further includes the mass loading layer which enables precise and easy adjustment of the resonant frequency.

Also, since the lower electrode is surrounded by the membrane layer, a material for the lower electrode can be more freely selected.

Although exemplary embodiments of the present invention have been described for illustrative purposes, those skilled in the art will appreciate that various modifications, additions and substitutions are possible, without departing from the scope and spirit of the invention as disclosed in the accompanying claims, including the full scope of equivalents thereof.

What is claimed is:

1. A thin film resonator comprising:
    a membrane layer formed on a substrate;
    a lower electrode formed on the membrane layer;
    a piezoelectric layer formed on the lower electrode;
    an upper electrode formed on the piezoelectric layer,
    wherein a top and bottom of said lower electrode are surrounded by the membrane layer,
    wherein said lower electrode is made of a material having a higher modulus of elasticity in tension than the membrane layer;
    a mass loading layer disposed sandwiched between the lower electrode and the membrane layer and having a predetermined thickness;
    wherein said mass loading layer is made of a material having a higher modulus of elasticity in tension than the membrane layer and a lower modulus of elasticity in tension than the lower electrode,
    wherein a resonant frequency variation by a change of a thickness of the mass loading layer is smaller than that by a change of a thickness of the upper electrode and greater than that by a change of a thickness of the membrane layer, when the same level of thickness changes are made to the mass loading layer, the upper electrode and the membrane layer which originally have the same thickness.

* * * * *